United States Patent [19]

Benn

[11] Patent Number: 4,961,818

[45] Date of Patent: * Oct. 9, 1990

[54] PROCESS FOR PRODUCING SINGLE CRYSTALS

[75] Inventor: Raymond C. Benn, Huntington, W. Va.

[73] Assignee: Inco Alloys International, Inc., Huntington, W. Va.

[ * ] Notice: The portion of the term of this patent subsequent to Feb. 13, 2007 has been disclaimed.

[21] Appl. No.: 747,292

[22] Filed: Jun. 21, 1985

[51] Int. Cl.⁵ ............................................. C30B 28/04
[52] U.S. Cl. ................................... 156/603; 148/410; 148/428; 148/13; 156/604; 156/DIG. 73; 156/DIG. 100; 228/194; 228/209; 228/263.13
[58] Field of Search .................. 156/603, 604, 616 R, 156/DIG. 73, DIG. 100; 148/410, 428; 75/0.5 BC, 0.5 BB, 0.5 BA; 228/194, 209, 263.13

[56] References Cited

U.S. PATENT DOCUMENTS

| 4,059,217 | 11/1977 | Woodward | 228/181 |
| 4,256,531 | 3/1981 | Kimura et al. | 156/620 |
| 4,386,979 | 6/1983 | Benn et al. | 148/410 |

OTHER PUBLICATIONS

Gilman; The Art and Science of Growing Crystals; John Wiley & Sons, Inc., New York 1963, pp. 420 and 459–460.

Primary Examiner—Robert J. Warden
Assistant Examiner—Timothy M. McMahon
Attorney, Agent, or Firm—Francis J. Mulligan, Jr.; Edward A. Steen

[57] ABSTRACT

A process for producing a single crystal object made of a nickel-base, O.D.S., gamma prime strengthened alloy which involves diffusion bonding a seed crystal to a mass of such alloy in recrystallizable state and thereafter zone annealing to grow a single crystal through the mass of alloy.

6 Claims, 1 Drawing Sheet

PROCESS FOR PRODUCING SINGLE CRYSTALS

TECHNICAL FIELD

This invention relates to a process for producing single crystals of gamma prime containing oxide dispersion hardened alloys.

BACKGROUND ART

It is known to produce single crystal metallic objects by casting. This is done in a mold which permits solidification to progress from one end of the mold toward the other end of the mold. At the part of the mold at which metal first solidifies there is a crystal selector structure which, by providing a tortuous path, causes metal which is freezing to become by competitive grain growth essentially single crystal metal by bending the freezing front around corners or around bends such as in a pigtail configuration. When the freezing front of metal enters the cavity proper of such a mold the metal is or should be freezing in the configuration of a single crystal. Thereafter, the freezing front is maintained in the principal cavity of the mold to produce single crystal objects such as turbine blades useful in the hot stages of gas turbine engines. U.S. Pat. No. 3,724,531 discloses such a method.

Such a method of producing single crystal casting is of no use when the alloy out of which the single crystal object is to be made is a metal which contains a dispersion of a material which does not form a liquid phase in the molten alloy. Specifically, if the nickel base alloy is hardened by a material such as thorium oxide e.g., the alloy known as TD nickel, or is hardened by refractory oxides such as yttrium oxide or oxidic compounds thereof (ODS alloys) and perhaps also hardened by gamma prime phase, for example, as in the alloy known as INCONEL alloy MA 6000, the oxidic hardening phase will not dissolve in molten alloy. If the alloy is molten to any significant extent at any stage in its manufacture, the oxidic phase will separate by gravity effects and not be effective for the purpose of hardening the alloy.

Alloys such as MA 6000 i.e., gamma prime containing ODS strengthened nickel-base alloys and many variants and improvements thereof, are normally made by a method called mechanical alloying. In this process, powders of the alloying ingredients are subjected to vigorous mechanical working in the presence of the desired oxidic dispersant until a significant fraction of saturation hardness of the alloying ingredients is obtained as well as an intimate combination of oxidic and metallic ingredients. The powders produced by mechanical alloying are then treated using powder metallurgical techniques specifically adapted for mechanically alloyed products and at no time during the manufacture of a mechanically alloyed object or during the life time of that object is the material melted. As stated before, if significant molten phase is produced the oxidic dispersion imparting strength to the mechanically alloyed object will be destroyed.

Reference is made to the text "The Art and Science of Growing Crystals" J.J. Gilman, Editor, J. Wiley & Sons Inc., 1963 as a source of general information relative to solid state epitaxial growth of single crystals on seeds.

SUMMARY OF THE INVENTION

The invention has as its objective and comprises a process for producing a single crystal object of controlled crystallographic orientation made of a dispersion strengthened, gamma prime strengthened nickel-base alloy. The process comprises providing a recrystallizable polycrystalline, dispersion strengthened gamma prime strengthened, gamma phase nickel-base alloy mass at least as large as the single crystal object to be produced, providing a single crystal seed object of controlled orientation made of a gamma phase nickel-base alloy closely matching in gamma phase lattice parameters the gamma phase lattice parameters of the dispersion strengthened, gamma prime strengthened gamma phase nickel-base alloy in the solution treated condition, preparing essentially oxidic and carbidic contaminant-free closely fitting faying surfaces on the single crystal seed object and on said alloy mass, diffusion bonding the seed object to the alloy mass at the faying surfaces and zone annealing the thus bonded object to epitaxially grow a single crystal from said bonded joint into the alloy mass. The zone annealing is characterized by relative motion between the bonded object and a localized, steep gradient, thermal energy source having an intensity sufficient to raise the local temperature of the bonded object above the solvus temperature of the gamma prime phase in the alloy mass to thereby provide a single crystal at the expense of the existing polycrystalline structure. Thereafter, if necessary the seed single crystal and excess metal of said mass are discarded to provide a single crystal, dispersion strengthened, gamma prime-containing, gamma phase nickel-base alloy object with controlled crystallographic orientation (texture).

As a preferred aspect of the invention, a small amount of boron, or other element that lowers the gamma prime solvus temperature is introduced at the locus of the bond between the seed and the alloy mass in order to facilitate diffusion bonding. This amount of boron also facilitates the epitaxial crystal growth across the bonded interface. The small amount of boron or similarly acting element can be introduced by sputtering or ion implantation on one or both of the faying surfaces. Alternatively, a very thin foil of a nickel-boron alloy such as an alloy which might be sold under the trademark METGLAS can be interposed between the faying surfaces prior to diffusion bonding and then diffused into the single crystal and polycrystalline structure. Directional recrystallization (or abnormal grain growth) is facilitated in gamma prime strengthened, oxide dispersion strengthened gamma phase alloys by the presence of boron because the effect appears to be "triggered" by the resolution of the gamma prime phase.

PREFERRED MODES FOR CARRYING OUT THE INVENTION

Gamma prime containing ODS nickel-base alloys which can be used in the present invention generally have compositions which fall within the limits of one or more of the alloying ingredient ranges as set forth in Table I.

TABLE I

| Alloy Ingredient | Broad (% by Wt.) | Preferred (% by Weight) |
| --- | --- | --- |
| Cr | 6-26 | 12-20 |
| Al + Ti | 5-10 | 6-9 |
| Mo | 0-15 | 0-3 |
| W | 0-12 | 0-6 |
| Nb | 0-6 | 0-4 |
| Ta | 0-12 | 0-6 |
| C | 0-0.3 | 0-0.2 |
| Zr | 0-0.3 | 0-0.15 |
| B | 0-0.3 | 0-0.01 |
| Co | 0-20 | 0-10 |
| Hf | 0-3 | 0-2 |
| Re | 0-4 | 0-2 |
| Y (as oxide) | 0.5-2.5 | 0.7-1.8 |
| Y (as metal) | 0-1 | 0-0.5 |
| V | 0-2 | 0-1 |
| Ni | Balance Essentially | Balance Essentially |

Figure 1:
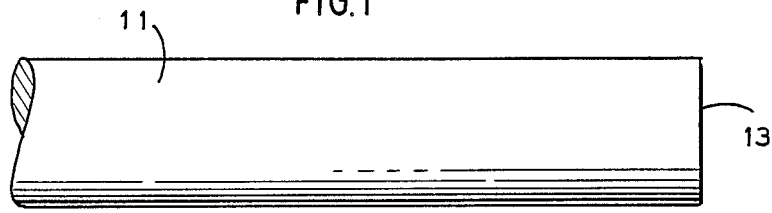
FIG. 1 of the drawing is a sketch of a bar of polycrystalline nickel-base alloy adapted to be transformed into a single crystal in accordance with the invention.

Polycrystalline, recrystallizable structures such as bar 11 in FIG. 1 of the drawing are made by mechanically working elemental and or pre-alloyed metal powders of a composition within the ranges set forth in Table I along with powders of yttria or an alumina-yttria compound until a significant fraction of saturation hardness along with an intimate admixture and dispersion of the oxide and metals are attained. The resulting worked (i.e., mechanically alloyed) powder is then compacted, for example, by hot isostatic pressing and/or hot worked, for example, by extrusion to produce the required metallic object. The object will be essentially of theoretical density and have a very fine recrystallizable grain structure.

Figure 2:
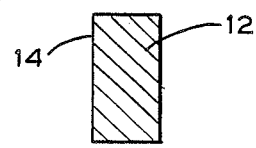
FIG. 2 of the drawing is a longitudinal sectional view of a single crystal seed usable in accordance with the present invention.

Single crystal seed 12, as depicted in FIG. 2 of the drawing having a controlled orientation (texture) can be produced in variety of ways and from a variety of materials. Seed 12 can of course be an ODS alloy, e.g., the same alloy which forms bar 11. Such a seed crystal 12 can be obtained by slicing a previously made single crystal bar. On the other hand, seed 12 can be any nickel-base alloy having lattice parameters which closely match the lattice parameters of the ODS alloy in a condition where gamma prime phase is in solution. In other words, the lattice parameters must match under the conditions of diffusion bonding and zone annealing. The seed nickel-base alloy must also be characterized as being in the solid state at diffusion bonding and zone annealing temperatures. Alloy compositions for satisfactory nickel-base alloy seed materials are set forth in Table II.

TABLE II

| Alloy Ingredient | Broad (% by Wt.) | Preferred (% by Wt.) |
| --- | --- | --- |
| Cr | 0-26 | 12-20 |
| Al & Ti | 0-10 | 6-9 |
| Mo | 0-15 | 0-3 |
| W | 0-12 | 0-6 |
| Nb | 0-6 | 0-4 |
| Ta | 0-12 | 0-6 |
| C | 0-0.3 | 0-0.2 |
| Zr | 0-0.3 | 0-0.15 |
| B | 0-5 | 0-0.01 |
| Co | 0-20 | 0-10 |
| Hf | 0-3 | 0-2 |
| Re | 0-4 | 0-2 |
| Y (as oxide) | 0-2.5 | 0.7-0.5 |
| Y (as metal) | 0-1 | 0-0.5 |
| V | 0-2 | 0-1 |
| Ni | Balance Essentially | Balance Essentially |

When the seed material is devoid of oxidic or other non-soluble dispersed phase, the seed may be made by casting such as in the method taught by Erikson et al in U.S. Pat. No. 3,724,531. Such a directionally solidified single crystal can then be conveniently sliced into a multiple of seeds.

Once bar 11 and seed 12 are provided, faying faces 13 and 14 on each are selected. Faying faces 13 and 14 are then ground, polished and lapped to provide as close as practical contact between the two surfaces when they abut each other. Faying faces 13 and 14 are also cleaned to remove contaminants, e.g., oxides and carbides and are thereafter kept in a protective medium, e.g., acetone until they are bonded together. In preparing faying surfaces 13 and 14 one can chemically modify the surfaces in order to facilitate diffusion bonding and subsequent epitaxial grain growth. For example, a thin nickel electrodeposit or vapor deposit can be formed on one or both of faying surfaces 13 or 14 to enhance bonding. The nickel deposit can contain depressants of the gamma prime solvus temperature such as boron or such depressants can be introduced into one or the other of faying surfaces 13 and 14 by sputtering or by interposing an extremely thin foil of depressant-containing metal between faying surfaces 13 and 14.

Figure 3:
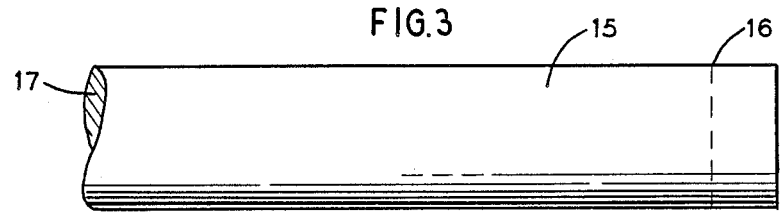
FIG. 3 is a sketch of a diffusion bonded single crystal/seed structure useful in the process of the present invention.

Diffusion bonding in vacuum or an inert atmosphere between faying surfaces 13 and 14 to produce bonded stock 15 depicted in FIG. 3 as having bond area 16 can be carried out at temperatures in the range of about 1010° to about 1100° C. (i.e., preferably 65°-155° Celsius units below the gamma prime solvus temperature) for up to four hours with the usual type of ODS alloy composition as tabulated in Table I. At these temperatures static pressures of order of 35 to 70 MPa pressing faying surfaces 13 and 14 together can be employed. In general, pressures sufficient to produce total deformations of approximately 1 to 3% should be used. Those skilled in the art will appreciate however that in addition to temperature and static pressure, diffusion bonding can be assisted by friction, applied ultrasonic energy, explosive impact etc. Use of any or all of these techniques alone or in combination with heat, static pressure and atmosphere control is contemplated in accordance with the present invention for diffusion bonding purposes. When gamma prime solvus temperature depressants or other bonding enhancers are employed in or on faying surfaces 13 and 14, the time of diffusion bonding should be extended so as to ensure diffusion of depressants or enhancers away from the bonding zone. Thus, even if adequate diffusion bonding in the presence of such depressants or enhancers might be accomplished in seconds using friction, explosive or ultrasonic forces, extra time should be allowed for diffusion of materials such as nickel or boron.

Once bonded stock 15 is obtained, bonded stock 15 is subjected to zone annealing in order to epitaxially grow a single crystal from bond area 16 toward bar end 17. This zone annealing, involving relative motion between bonded stock 15 and a small, steep gradient thermal energy source, should be carried out at a temperature between the alloy melting point and the gamma prime solvus temperature. It may be advantageous to so design the thermal energy source so as to heat the center of bonded stock 15 slightly higher than the surface to prevent spurious grain nucleation and/or growth elsewhere. This can effectively be done for example, by gas cooling the surface while heating bonded stock 15 by direct electroinductive heating. Induction heating is preferably carried out at a relatively low frequency using equipment capable of providing the preferred higher energy density in the annealing zone at the center of bonded stock 15. The thermal gradient between the zone being annealed and the unannealed portion of bonded stock 15 should be at least about 75° in Celsius units/cm measured at the gamma prime solvus temperature. As an alternative, zone annealing can be accomplished by indirect inductive heating using a coil and a susceptor shaped to achieve the aforedescribed heating pattern in which case high frequency induction heating is satisfactory. As a further alternative, zone annealing can be accomplished in a tube-like furnace having a narrow heated section by causing bonded stock 15 to pass therethrough. The latter situation suffices when it is not necessary to heat the center of bonded stock 15 slightly higher than the surface.

When bonded stock 15 has been zone annealed, it now comprises an epitaxially grown single crystal of controlled orientation. Seed crystals can be sliced from the stock and single crystal objects can be machined therefrom. If seed 12 is an ODS alloy of the same composition as bar 11, it need not be removed. Even if seed 12 is not an ODS alloy but is an alloy suitable for a portion of an object, e.g., the root section of a turbine blade, it may remain as a part of the product of the process of the invention. Generally however, the seed portion to the right of bond area 16 on bonded stock 15 is removed to provide the single crystal ODS alloy product. Bar 11 may be of extended length so as to provide, when sliced, single crystal material for two or more single crystal articles such as turbine blades.

Figure 4:
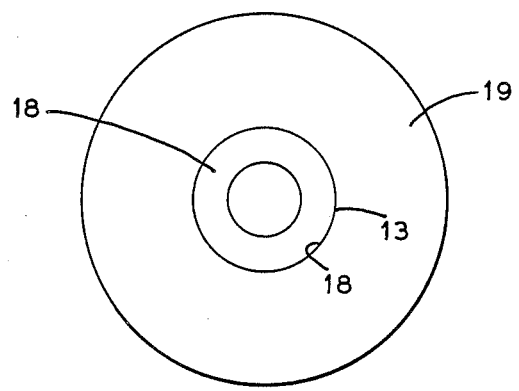
FIG. 4 is a view in outline of a wheel preform useful in the process of the present invention.

Those skilled in the art will appreciate that, as depicted, seed 12 is the same diameter as bar 11. This is not necessarily the case. Smaller diameter seed can be employed provided that, after bonding, and before zone annealing the material of bar 11 extending beyond the edge of seed 12 is machined or ground to a taper of at least 135° measured with respect to the axis of seed 12 from the non-faying surface end of seed 12. It is also to be understood that even though as depicted, bar 11 is cylindrical, the invention is not limited to cylindrical objects but is broadly applicable to shapes of extended length or even to disc-like performs such as shown in FIG. 4. This preform is adapted by means of an annular diffusion bonded seed crystal 18 to provide a single crystal disc 19.

While in accordance with the provisions of the statute, there is illustrated and described herein specific embodiments of the invention, those skilled in the art will understand that changes may be made in the form of the invention covered by the claims and that certain features of the invention may sometimes be used to advantage without a corresponding use of the other features.

I claim:

1. A process for producing a single crystal object made of dispersion strengthened, gamma prime strengthened nickel-base alloy comprising providing a recrystallizable polycrystalline, dispersion strengthened gamma prime strengthened, gamma phase nickel-base alloy mass at least as large as the single crystal object to be produced, providing a single crystal seed object made of a gamma phase nickel-base alloy closely matching in gamma phase lattice parameters the gamma phase lattice parameters of said dispersion strengthened, gamma prime strengthened gamma phase nickel-base alloy in the solution treated condition, preparing essentially oxidic and carbidic contaminant-free closely fitting faying surfaces on said single crystal seed object and on said alloy mass, diffusion bonding said seed object to said alloy mass at said faying surfaces while maintaining static pressure normal to said faying surfaces sufficient to produce a total deformation of about 1-3%, zone annealing said bonded object in the absence of a molten phase to epitaxially grow a single crystal from said bonded joint into said alloy mass, said zone annealing being characterized by relative motion between said bonded object and a localized steep gradient thermal energy source having an intensity sufficient to raise the local temperature of said bonded object above the solvus temperature of the gamma prime phase in said alloy mass to thereby provide a single crystal at the expense of the existing polycrystalline structure and thereafter, if necessary discarding the seed single crystal and excess metal of said mass to provide a single crystal dispersion strengthened, gamma prime-containing, gamma phase nickel-base alloy object of controlled orientation.

2. A process as in claim 1 wherein said seed object is made of the same alloy as is said alloy mass.

3. A process as in claim 1 wherein said alloy mass is a bar.

4. A process as in claim 1 wherein a bond enhancing material is located at or between said faying surfaces prior to diffusion bonding.

5. A process as in claim 4 in which said bond enhancing material is a nickel-base alloy containing an effective amount of an element capable of lowering the gamma prime solvus temperature of the alloy comprising said recrystallizable polycrystalline alloy mass.

6. A process as in claim 5 in which said element is boron.

* * * * *